United States Patent
Oh

(10) Patent No.: US 7,876,635 B2
(45) Date of Patent: Jan. 25, 2011

(54) SENSE AMPLIFIER DRIVING CONTROL CIRCUIT AND METHOD

(75) Inventor: Seung-Min Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 87 days.

(21) Appl. No.: 12/427,934

(22) Filed: Apr. 22, 2009

(65) Prior Publication Data
US 2010/0039873 A1 Feb. 18, 2010

(30) Foreign Application Priority Data
Aug. 14, 2008 (KR) .................. 10-2008-0079861

(51) Int. Cl.
*G11C 7/00* (2006.01)
(52) U.S. Cl. ........................ 365/205; 365/207
(58) Field of Classification Search .................. 365/204
See application file for complete search history.

(56) References Cited

U.S. PATENT DOCUMENTS 6,717,880 B2* 4/2004 Jeong .................... 365/189.07
7,613,059 B2* 11/2009 Kang .................... 365/207

FOREIGN PATENT DOCUMENTS

KR 1020070036628 A 4/2007
KR 1020070036633 A 4/2007

OTHER PUBLICATIONS

Notice of Allowance issued from Korean Intellectual Property Office on Aug. 31, 2009 with an Enligh Translation.

* cited by examiner

*Primary Examiner*—Tan T. Nguyen
(74) *Attorney, Agent, or Firm*—IP & T Group LLP

(57) ABSTRACT

A sense amplifier driving control circuit has a stable discharge characteristic by differently controlling the discharge of a node having a driving voltage according to the change of an organization of a semiconductor memory device. The sense amplifier driving control circuit includes a pull-down driving block configured to provide a pull-down voltage for a pull-down operation of the sense amplifier, a pull-up driving block configured to sequentially provide a first voltage for the overdrive and a second voltage for the normal drive as a pull-up voltage for a pull-up operation of the sense amplifier, wherein a voltage level of the second voltage is lower than that of the first voltage, and a discharging block configured to discharge the node having the second voltage by controlling a amount of the discharging according to an organization of the semiconductor memory device.

21 Claims, 7 Drawing Sheets

FIG. 1A
(PRIOR ART)
FIG. 1B
(PRIOR ART)
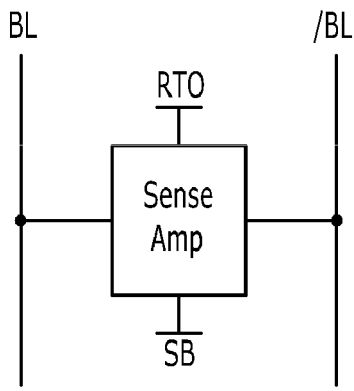
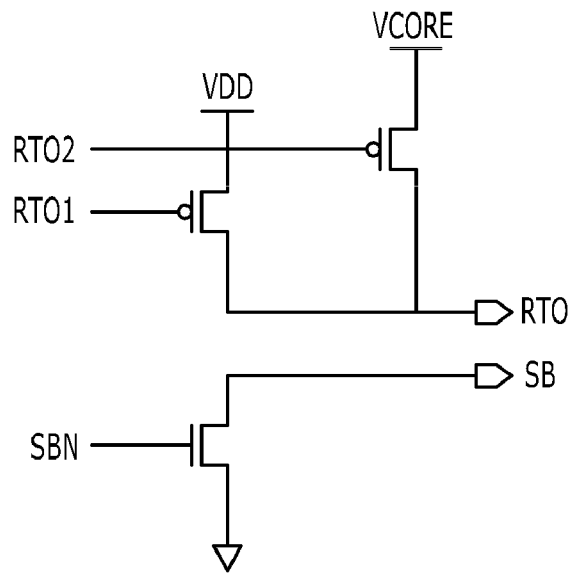
FIG. 2
(PRIOR ART)
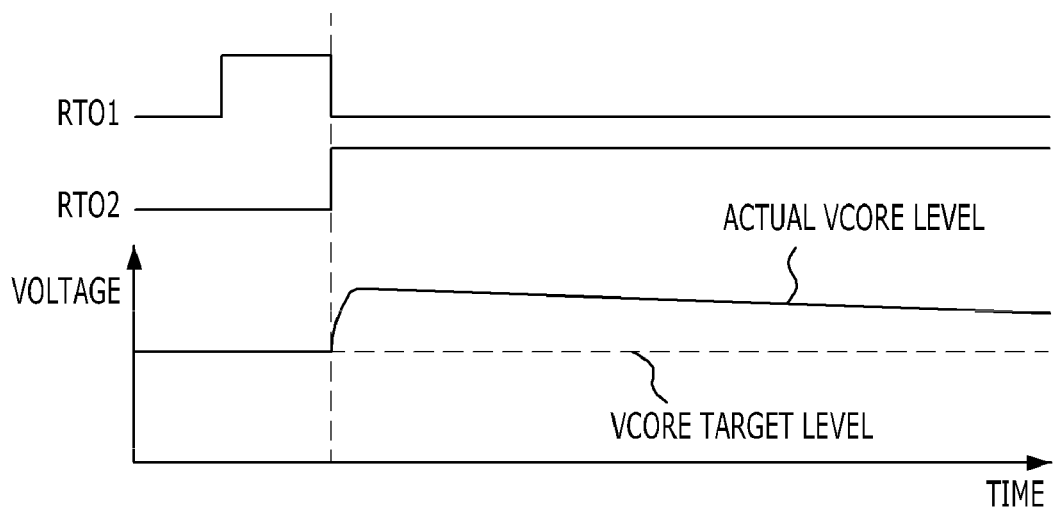

SENSE AMPLIFIER DRIVING CONTROL CIRCUIT AND METHOD

CROSS-REFERENCE TO RELATED APPLICATIONS

The present invention claims priority of Korean patent application number 10-2008-0079861, filed on Aug. 14, 2008, which is incorporated by reference in its entirety.

BACKGROUND OF THE INVENTION

The present invention relates to a semiconductor memory device, and more particularly, to a sense amplifier driving control circuit and method for controlling the discharge of a driving voltage of a circuit using an overdrive circuit. The sense amplifier driving control circuit discharges a core voltage used as the driving voltage.

A semiconductor memory device employs a sense amplifier to sense data and the sense amplifier is driven by a pull-up voltage and a pull-down voltage to perform a data sensing operation.

Referring to FIG. 1A, a pull-up voltage RTO and a pull-down voltage SB are supplied to a pull-up node and a pull-down node of a general sense amplifier, respectively. The sense amplifier detects a voltage difference between bit lines BL and /BL and amplifies that to a voltage difference between a core voltage VCORE and a ground voltage VSS by using the pull-up voltage RTO and the pull-down voltage SB.

That is, for the operation in the sense amplifier, the core voltage VCORE and the ground voltage VSS should be provided as the pull-up voltage RTO and the pull-down voltage SB, respectively. However, to improve tRCD performance by making the sense amplifier to sense relatively fast, the pull-up voltage RTO is provided with a supply voltage VDD during an overdrive period, which is a high pulse period of an overdrive control signal RTO1 as described in FIG. 1B.

Referring to FIG. 1B, as the overdrive control signal RTO1 transits to a low level and thus the overdrive period is terminated, at the same time thereof, a normal drive control signal RTO2 is enabled to a high level and then the pull-up voltage RTO provided to the sense amplifier is changed from the supply voltage VDD to the core voltage VCORE. At this time, a voltage level of the core voltage VCORE is raised by the inflow of a current due to the supply voltage VDD provided to the pull-up voltage RTO. Therefore, a circuit for recovering a voltage level of the core voltage VCORE that is raised by the supply voltage VDD to a target VCORE level is required. This circuit is called a core voltage (VCORE) discharge circuit.

FIG. 2 shows a phenomenon where the core voltage VCORE is raised by the overdrive. As the overdrive control signal RTO1 is disabled and the normal drive control signal RTO2 is enabled, the core voltage VCORE is raised by the supply voltage VDD provided to the pull-up voltage RTO and thus the core voltage VCORE becomes higher than the target voltage.

Therefore, if there is no VCORE discharge circuit, the voltage level of the core voltage VCORE starts to fall to its target voltage level slightly by a leakage phenomenon of a transistor or a small discharge transistor disposed in a core voltage driver for the stability of the voltage level of the core voltage VCORE. As such, it is difficult to maintain the target voltage level of the core voltage VCORE that is determined for an operation of a dynamic random access memory device (DRAM) and this could be a factor of inducing fail in the DRAM operation.

FIG. 3 illustrates a circuit diagram of a typical core voltage discharge circuit. Herein, a discharge control signal VCR_ON for controlling the discharge of the core voltage VCORE has a high value by being synchronized with a falling edge of the overdrive control signal RTO1. The core voltage discharge circuit operates during a period where the discharge control signal VCR_ON has the high value and in general the period has a time of about tens of nano seconds (ns).

In FIG. 3, a reference voltage VREFC is a reference voltage of the core voltage VCORE and generated from a reference voltage generator. Herein, it is assumed that the reference voltage VREFC has a voltage level of VCORE/2.

When the discharge control signal VCR_ON has a high level, a high level is coupled to a transistor N3 and thus a differential comparator including the transistor N3 is activated. The differential comparator compares the reference voltage VREFC with a voltage HFVCORE having a voltage level of VCORE/2 that is obtained by performing a voltage divide operation using two diode-connected transistors N9 and N10. If the voltage level of the core voltage VCORE is raised by the overdrive, the voltage HFVCORE has a higher voltage level than the reference voltage VREFC.

Thus, larger current flows through a transistor N2 and the potential of a node B becomes lower. This increases the drivability of a transistor P4 and thus the potential of a node DIS_N is raised. The raised voltage of the node DIS_N turns on a discharge transistor N7 and thus the core voltage VCORE is discharged.

FIG. 4 illustrates a typical circuit for generating the core voltage VCORE. In FIG. 4, the reference voltage VREFC is coupled to one input node of a comparator and the other input node of the comparator is connected to a node having a voltage level of VCORE/2 in a resistance divider of the core voltage VCORE, thereby allowing the core voltage VCORE to preserve a voltage level of 2 times of the stable voltage level of the reference voltage VREFC.

FIG. 5 is a view showing that the number of word lines WL is changed according to organizations of a semiconductor memory device. As illustrated in FIG. 5, in case of an X16 organization, a word line WL of a down bank and that of an up bank are generated at the same time. In the meantime, in case of X8 and X4 organizations, a word line WL of the up bank or that of the down bank is only generated according to row addresses.

When the semiconductor memory device operates in the X16 organization, a number of operating sense amplifiers is twice as large compared to that of the X4 or X8 organization. Thus, current of at least twice in magnitude compared to that of the X4 or X8 organization in response to the overdrive flows into the core voltage VCORE and the potential of the core voltage VCORE becomes higher than that in the case of the X4 or X8 organization.

On the other hand, when the semiconductor memory device operates in the X4 or X8 organization, relatively small current flows into the core voltage VCORE and thus the potential of the core voltage VCORE is only slightly raised as compared to the case of the X16 organization.

However, although the organization is changed, a discharge amount of the core voltage VCORE is not changed. If a discharge transistor for the core voltage VCORE is designed according to the X16 operation, the core voltage VCORE whose potential is raised by the overdrive is sufficiently discharged. But, in the X8 or X4 organization, although the sufficient discharge is performed in a discharge period, the discharge is continuously performed and opposes the core voltage drive. The opposition makes the voltage level of the core voltage VCORE to be lower than a target internal supply voltage level, so that a ringing phenomenon may occur. As a result, the current consumption also increases due to a current loss.

FIG. 6 is a view showing a side effect occurring when the discharge of the core voltage VCORE is constant while an amount of current due to the supply voltage VDD provided to the core voltage VCORE is changed according to the organizations.

This problem is one factor that induces a failure in the operation of a product employing X4, X8 and X16 organizations that are designed in one chip. This requires a size tuning of a discharge transistor and a discharge time tuning, resulting in the increase of development costs.

Although the tunings are performed, the problem is not perfectly solved and thus the core voltage level may become unstable. As a result, various functional deteriorations may occur. These kinds of failures are becoming much more serious when continuous read operations are performed.

SUMMARY OF THE INVENTION

An embodiment of the present invention is directed to providing a sense amplifier driving control circuit and method having a stable discharge characteristic by differently controlling the discharge of a driving voltage according to a change of an organization.

Another embodiment of the present invention is to provide a core voltage discharge circuit that prevents function deterioration by adjusting the discharge of a core voltage according to a change of an organization and thus stabilizing the core voltage.

In accordance with an aspect of the present invention, there is provided a sense amplifier driving control circuit for driving a sense amplifier by sequentially employing an overdrive and a normal drive, which includes a pull-down driving block configured to provide a pull-down voltage for a pull-down operation of the sense amplifier, a pull-up driving block configured to sequentially provide a first voltage for the overdrive and a second voltage for the normal drive as a pull-up voltage for a pull-up operation of the sense amplifier, wherein a voltage level of the second voltage is lower than that of the first voltage, and a discharging block configured to discharge a node having the second voltage by controlling a amount of the discharging according to an organization of a semiconductor memory device.

In accordance with another aspect of the present invention, there is provided a core voltage discharging circuit including a differential amplifying block configured to perform a differential amplification for a reference voltage and a input voltage in response to a discharge control signal; and a driving block configured to differently perform a discharge of a node having the input voltage according to different states of a mode control signal corresponding to different organizations of semiconductor memory devices, respectively.

In accordance with still another aspect of the present invention, there is provided a method for driving a sense amplifier, the method including providing a voltage for a pull-down operation of the sense amplifier, providing an overdrive voltage for a pull-up operation of the sense amplifier, providing a normal drive voltage for the pull-up operation of the sense amplifier after providing the overdrive voltage, and discharging a node having the normal drive voltage differently according to different organizations of semiconductor memory devices, respectively, when the normal drive voltage becomes higher than a target level during a time period for providing the normal drive voltage.

BRIEF DESCRIPTION OF THE DRAWINGS

FIGS. 1A and 1B illustrate views of a typical sense amplifier and a circuit for providing supply voltages required in an operation of the sense amplifier, respectively.

FIG. 2 illustrates a phenomenon where a voltage level of a core voltage is increased by the overdrive.

DESCRIPTION OF SPECIFIC EMBODIMENTS

Other objects and advantages of the present invention can be understood by the following description, and become apparent with reference to the embodiments of the present invention.

The present invention provides a semiconductor memory device including an overdrive circuit that has a discharging function to recover a voltage level of a core voltage to a target voltage level after applying an overdrive when overdriving the core voltage with a higher voltage, i.e., a supply voltage VDD, for a predetermined period in order to improve tRCD in a high speed memory device.

To implement the semiconductor memory device, the present invention provides a core voltage discharge driver having a construction for varying the number of transistors that are turned on according to an organization.

That is, for instance, one discharge driver is only turned on in case of a X8 or X4 organization and two discharge drivers are turned on in case of a X16 organization, so that it is possible to secure a stabilized discharge characteristic by differentiating discharge amount from a node having the supply voltage VDD provided to a core voltage VCORE as the organization is changed.

Figure 7:
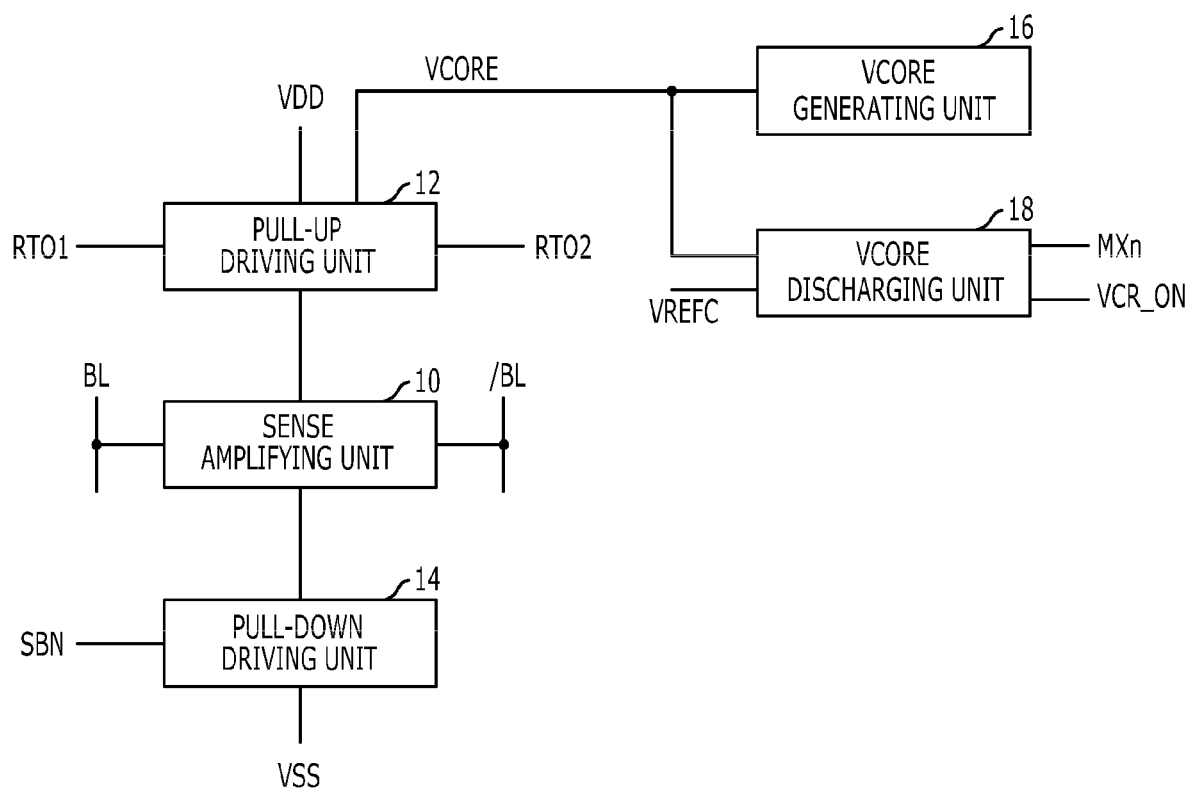
FIG. 7 illustrates a block diagram of a sense amplifier driving control circuit in accordance with an embodiment of the present invention.

FIG. 7 illustrates a block diagram of a sense amplifier driving control circuit in accordance with an embodiment of the present invention. Referring to FIG. 7, the sense amplifier driving control circuit includes a sense amplifying unit 10, a pull-up driving unit 12, a pull-down driving unit 14, a core voltage (VCORE) generating unit 16, and a core voltage (VCORE) discharging unit 18.

The sense amplifying unit 10 is disposed between bit lines BL and /BL and driven by a pull-up voltage coupled to a pull-up node and a pull-down voltage supplied to a pull-down node. The pull-up voltage of the sense amplifying unit 10 is provided by the pull-up driving unit 12 and the pull-down voltage thereof is provided by the pull-down driving unit 14.

The pull-down driving unit 14 includes an NMOS transistor that is switched by a pull-down control signal SBN and provides the pull-down node of the sense amplifying unit 10 with a ground voltage VSS as the pull-down voltage.

The pull-up driving unit 12 provides the sense amplifying unit 10 with a supply voltage VDD in response to an overdrive control signal RTO1. For this purpose, the pull-up driving unit 12 includes a PMOS transistor that is switched by the overdrive control signal RTO1. Further, the pull-up driving unit 12 provides the sense amplifying unit 10 with a core voltage VCORE in response to a normal drive control signal RTO2 by including a PMOS transistor that is switched by the normal drive control signal RTO2. The pull-up driving unit 12 firstly provides the supply voltage VDD for the overdrive of the sense amplifying unit 10 and then supplies the core voltage VCORE for the normal drive of the sense amplifying unit 10.

Figure 3:
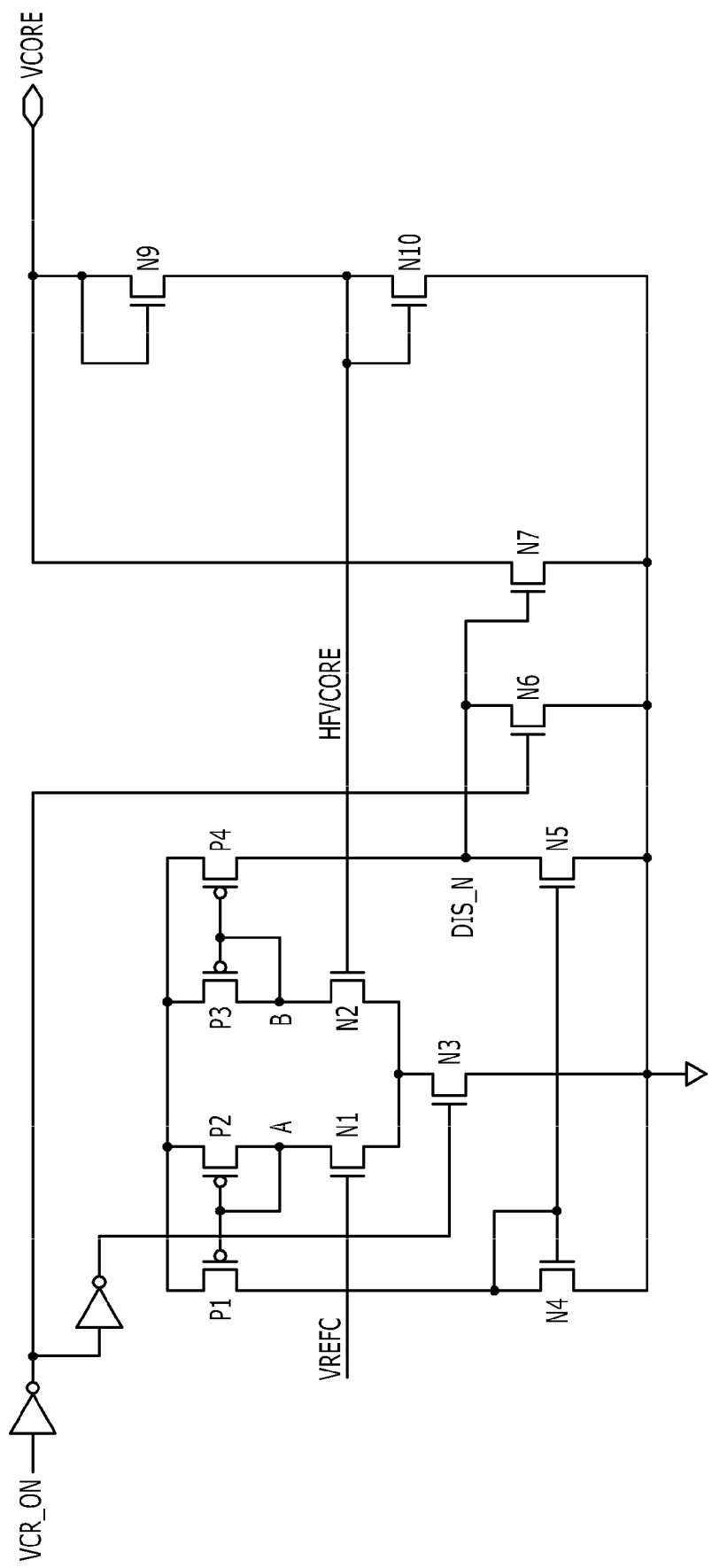
FIG. 3 illustrates a circuit diagram of a typical core voltage discharge circuit.
Figure 4:
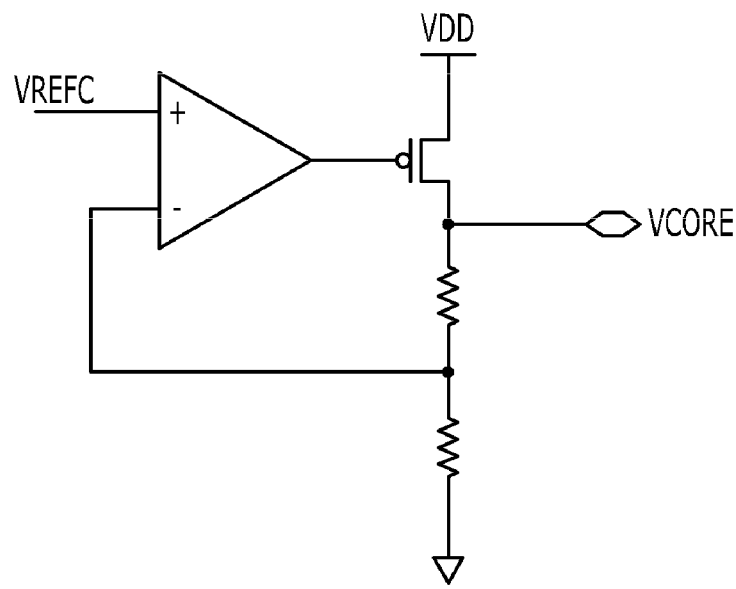
FIG. 4 illustrates a circuit diagram of a typical core voltage generating circuit.
Figure 5:
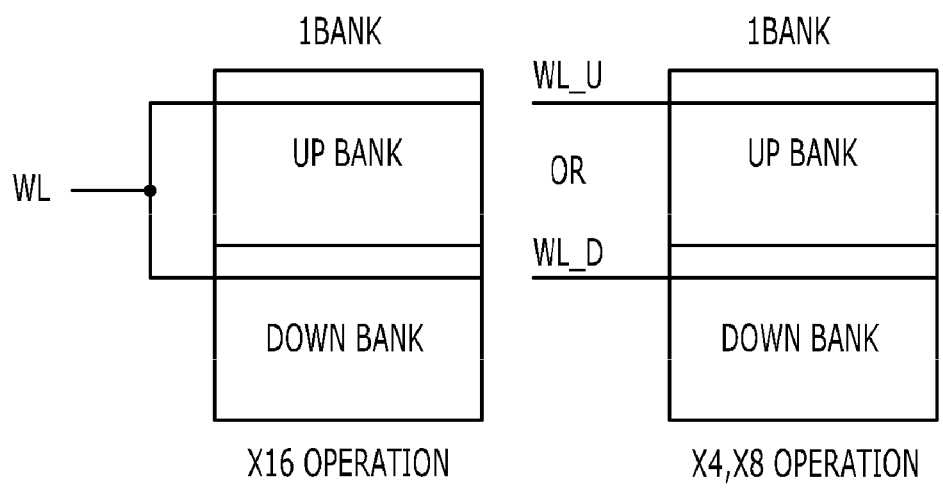
FIG. 5 is a view showing that the number of word lines is changed according to organizations of a semiconductor memory device.
Figure 6:
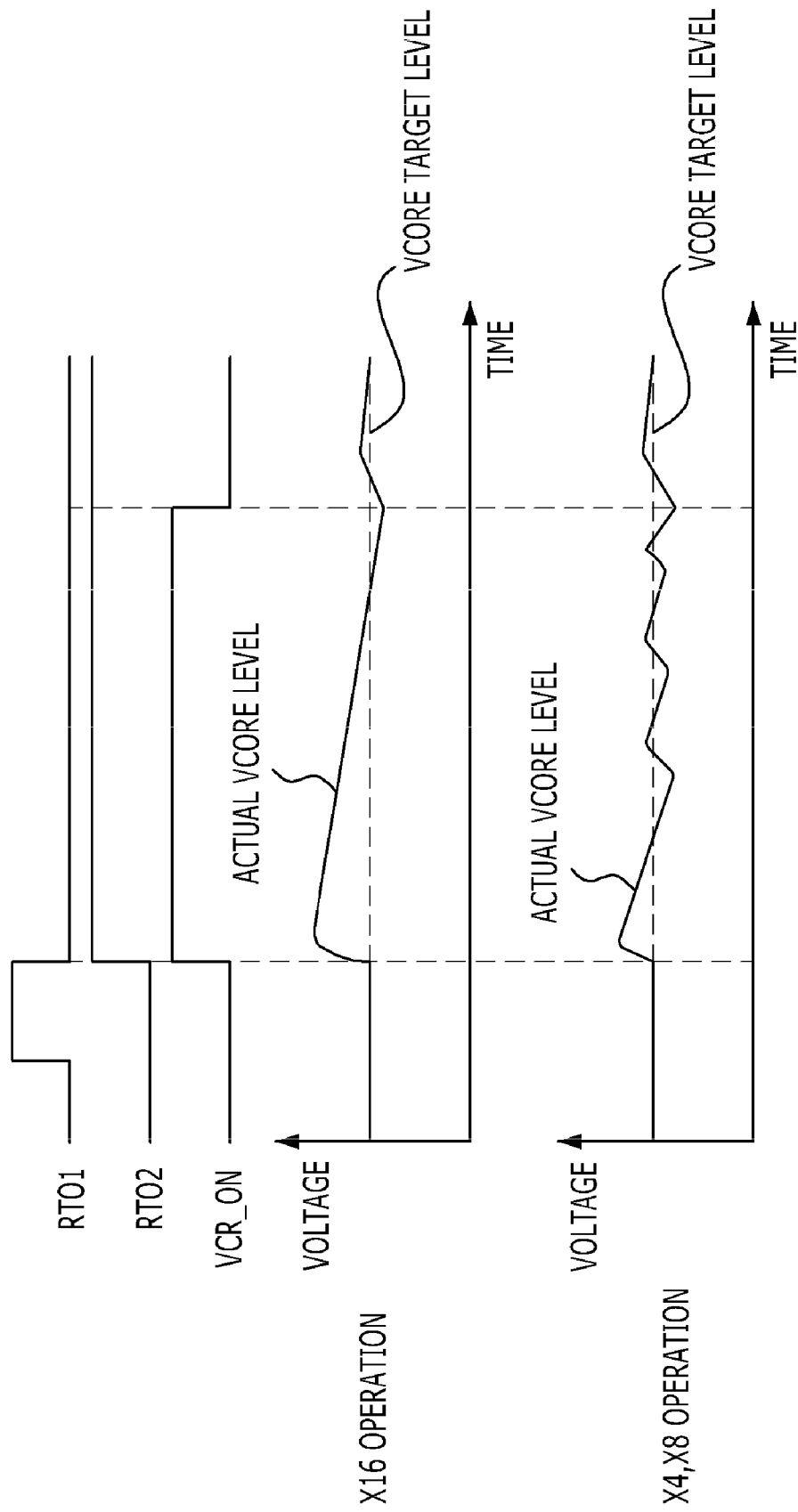
FIG. 6 is a view showing voltage levels of a core voltage according to the organizations.

The core voltage VCORE is provided by the VCORE generating unit 16 and the VCORE generating unit 16 generates the core voltage VCORE based on the supply voltage VDD using a circuit such as that illustrated in FIG. 4.

The core voltage VCORE generated in the VCORE generating unit 16 is discharged by the VCORE discharging unit 18 after the overdrive is terminated. The VCORE discharging unit 18 is controlled by a mode signal MXn and a discharge control signal VCR_ON.

Herein, for instance, the mode signal MXn may be provided which may be disabled in case of a X8 or X4 organization and enabled in case of a X16 organization, thereby adjusting the discharge of the core voltage VCORE as the organization is changed.

It is preferable that the discharge control signal VCR_ON is synchronized with a falling edge of the overdrive control signal RTO1. The VCORE discharging unit 18 will be described later with reference to FIGS. 8 and 9.

Meanwhile, the sense amplifier driving control circuit may further include a drive control unit, a detailed description of which is omitted for the convenience. The drive control unit provides the pull-down control signal SBN, the overdrive control signal RTO1, the normal drive control signal RTO2 and the discharge control signal VCR_ON used for the operation of the sense amplifier driving control circuit illustrated in FIG. 7. The pull-down control signal SBN may be synchronized with a point of time just before the overdrive control signal RTO1 is enabled or may be provided in an enable state at a time prior to the point of time. The overdrive control signal RTO1 may be provided in an enable state at a time prior to the enable time of the normal drive control signal RTO2. The discharge control signal VCR_ON may be synchronized with the falling edge of the overdrive control signal RTO1.

As described above, the VCORE discharging unit 18 controls the discharge of the core voltage VCORE by changing a mode according to the organization. That is, a discharge amount of the core voltage VCORE is changed according to the organization.

Figure 8:
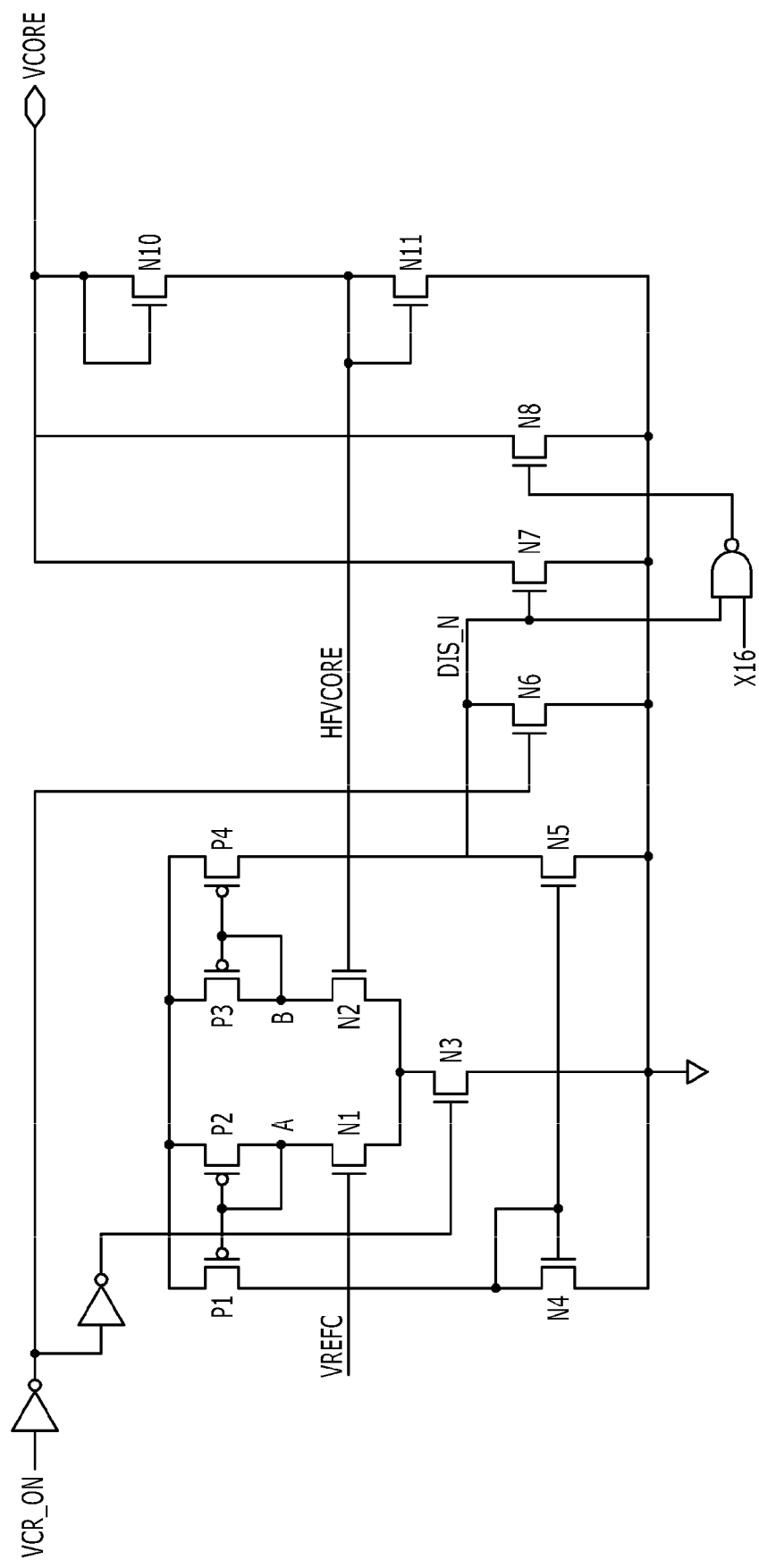
FIG. 8 illustrates a circuit diagram of a core voltage discharging unit in accordance with an embodiment of the present invention.
Figure 9:
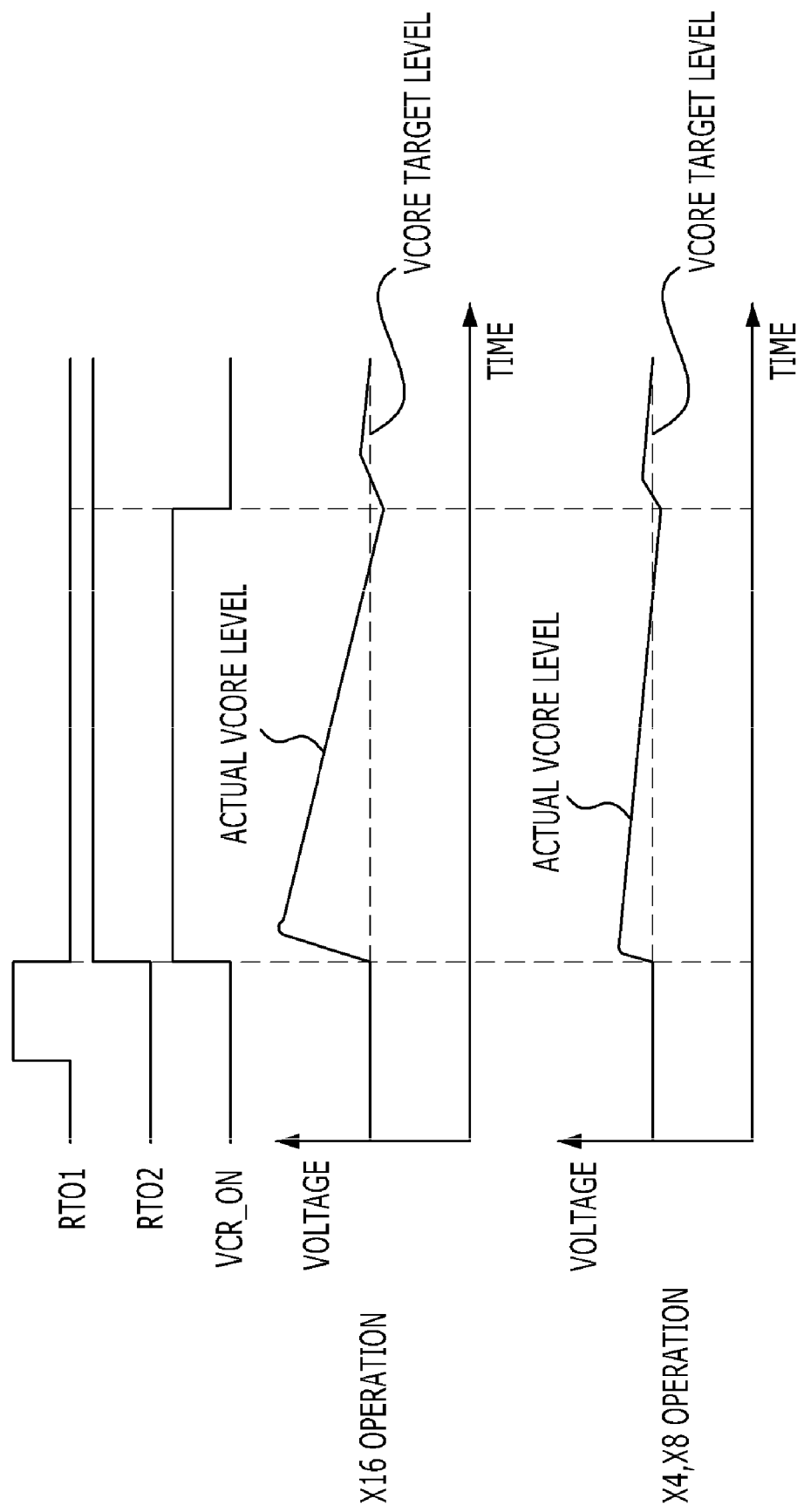
FIG. 9 is a view showing voltage levels of a core voltage according to organizations in accordance with the present invention.

This will be described with reference to FIGS. 8 and 9 hereinafter. FIG. 8 illustrates a circuit diagram of the core voltage discharging unit 18 in accordance with an embodiment of the present invention.

In FIG. 8, if the discharge control signal VCR_ON has a high level, the high level is coupled to a transistor N3 and thus a differential comparator is activated. The differential comparator compares a reference voltage VREFC and a voltage HFVCORE having a voltage level of VCORE/2 that is obtained by performing a voltage division operation for the core voltage VCORE using diode-connected transistors N10 and N11.

If the voltage level of the core voltage VCORE is raised by the overdrive, the voltage HFVCORE may have the potential higher than that of the reference voltage VREFC. Thus, more current flows through a transistor N2 and the potential at a node B may be decreased. This increases the drivability of a transistor P4 and thus the potential at a node DIS_N is increased.

The increased voltage at the node DIS_N may turn on two discharge transistors, e.g., N7 and N8, in response to a signal X16, which is enabled to a low level in case of the X16 organization. And the raised voltage may turn on one discharge transistor, e.g., N7, since the signal X16 is disabled to a high level in case of the X8 or X4 organization. Herein, the signal X16 corresponds to the mode signal MXn in FIG. 7. That is, in case of the X16 organization, the discharge current of the core voltage VCORE may be increased to more than 2 times that in case of the X4 or X8 organization. Therefore, as described in FIG. 9, it is possible to maintain a stable VCORE level without a voltage level drop due to the discharge of the core voltage VCORE in the X4 or X8 organization as well.

In accordance with the embodiments of the present invention, it is possible to obtain the stabilized discharge characteristic by differently controlling the discharge of a driving voltage according to the change of the organization. As a result, the core voltage VCORE is stabilized and thus the function deterioration can be prevented.

While the present invention has been described with respect to the specific embodiments, it will be apparent to those skilled in the art that various changes and modifications may be made without departing from the spirit and scope of the invention as defined in the following claims.

What is claimed is:

1. A sense amplifier driving control circuit for driving a sense amplifier by sequentially employing an overdrive and a normal drive, comprises:
   a pull-down driving block configured to provide a pull-down voltage for a pull-down operation of the sense amplifier;
   a pull-up driving block configured to sequentially provide a first voltage for the overdrive and a second voltage for the normal drive as a pull-up voltage for a pull-up operation of the sense amplifier, wherein a voltage level of the second voltage is lower than that of the first voltage; and
   a discharging block configured to discharge a node having the second voltage by controlling an amount of the discharging according to an organization of a semiconductor memory device.

2. The sense amplifier driving control circuit of claim 1, wherein the discharging block includes a plurality of transistors connected in parallel with each other with respect to the second voltage and the discharge amount is controlled according to the number of transistors that are turned on according to the organization.

3. The sense amplifier driving control circuit of claim 1, wherein the organization is one of a plurality of organizations that are classified by different numbers of word lines that are enabled at the same time, respectively.

4. The sense amplifier driving control circuit of claim 3, wherein the discharging block is additionally configured to receive a signal having information for the number of word lines and perform the discharge if at least any one of criteria for the organization and the information is satisfied.

5. The sense amplifier driving control circuit of claim 1, wherein the second voltage is a core voltage.

6. The sense amplifier driving control circuit of claim 5, wherein the discharging block includes:
   a differential amplifying unit configured to perform differential amplification for a reference voltage and the core voltage in response to a discharge control signal synchronized with a state of employing the overdrive and the normal drive for the sense amplifier; and a driving unit configured to differently perform the discharge for the core voltage according to different states of a mode control signal corresponding to different organizations, respectively.

7. The sense amplifier driving control circuit of claim 6, wherein the differential amplifying unit includes:
   an input element configured to receive the discharge control signal;
   a driving element configured to be driven by an output of the input element;
   an amplifying element configured to differentially amplify the reference voltage and the core voltage; and
   a transmitting element configured to transmit a differential amplification signal of the amplifying unit to the driving unit according to a state of the discharge control signal.

8. The sense amplifier driving control circuit of claim 7, wherein the transmitting element is configured to be controlled by the discharge control signal and perform a switching operation between an output node of the amplifying element and a ground.

9. The sense amplifier driving control circuit of claim 6, wherein the driving unit includes:
   a first discharging element configured to discharge the node in response to an output signal of the differential amplifying unit; and
   a second discharging element configured to discharge the node in response to the output signal of the differential amplifying unit and a state of the mode control signal.

10. The sense amplifier driving control circuit of claim 9, wherein the second discharging element includes:
    a logic gate configured to perform a NAND operation on the output signal of the differential amplifying unit and the mode control signal; and
    a discharging element configured to switch in response to an output signal of the logic gate to discharge the node.

11. A core voltage discharging circuit, comprising:
    a differential amplifying block configured to perform a differential amplification for a reference voltage and an input voltage in response to a discharge control signal; and
    a driving block configured to differently perform a discharge of a node having the input voltage according to different states of a mode control signal corresponding to different organizations of semiconductor memory devices, respectively.

12. The core voltage discharging circuit of claim 11, wherein the organizations have different numbers of word lines that are enabled at the same time, respectively.

13. The core voltage discharging circuit of claim 12, wherein the driving block is additionally configured to receive a signal having information for the number of word lines and perform the discharge if any one of criteria for the organization and the information is satisfied.

14. The core voltage discharging circuit of claim 11, wherein the driving block includes a plurality of transistors connected in parallel with each other with respect to the input voltage and a discharge amount from the node having the input voltage is controlled according to the number of transistors that are turned on according to the organizations.

15. The core voltage discharging circuit of claim 14, wherein the differential amplifying block includes:
    an input unit configured to receive the discharge control signal;
    a driving unit configured to be driven by an output of the input unit;
    an amplifying unit configured to differentially amplify the reference voltage and the input voltage; and
    a transmitting unit configured to transmit a differential amplification signal of the amplifying unit to the driving unit according to a state of the discharge control signal.

16. The core voltage discharging circuit of claim 15, wherein the transmitting unit is configured to be controlled by the discharge control signal and perform a switching operation between an output node of the amplifying unit and a ground.

17. The core voltage discharging circuit of claim 14, wherein the driving block includes:
    a first discharging unit configured to discharge the input voltage in response to an output signal of the differential amplifying block; and
    a second discharging unit configured to discharge the input voltage in response to the output signal of the differential amplifying block and a state of the mode control signal.

18. The core voltage discharging circuit of claim 17, wherein the second discharging unit includes:
    a logic gate to perform a NAND operation on the output signal of the differential amplifying block and the mode control signal; and
    a discharging element switched in response to an output signal of the logic gate to discharge the node.

19. A method for driving a sense amplifier, the method comprising:
    providing a voltage for a pull-down operation of the sense amplifier;
    providing an overdrive voltage for a pull-up operation of the sense amplifier;
    providing a normal drive voltage for the pull-up operation of the sense amplifier after providing the overdrive voltage; and
    discharging a node having the normal drive voltage differently according to different organizations of semiconductor memory devices, respectively, when the normal drive voltage becomes higher than a target level during a time period for providing the normal drive voltage.

20. The method of claim 19, wherein the different organizations are classified by different numbers of word lines that are enabled at the same time, respectively.

21. The method of claim 19, wherein the discharge is synchronized with a point of time that a supply of the overdrive voltage is terminated.

* * * * *